United States Patent
Umayahara et al.

(10) Patent No.: US 6,699,605 B2
(45) Date of Patent: Mar. 2, 2004

(54) GLASS CERAMIC LAMINATE BECOMING RELATIVELY HIGH IN BENDING STRENGTH AFTER FIRED

(75) Inventors: Yoshio Umayahara, Kusatsu (JP); Yoshikatsu Nishikawa, Otsu (JP); Kazuyoshi Shindo, Otsu (JP)

(73) Assignee: Nippon Electric Glass Co., LTD, Otsu (JP)

( * ) Notice: Subject to any disclaimer, the term of this patent is extended or adjusted under 35 U.S.C. 154(b) by 0 days.

(21) Appl. No.: 10/223,796

(22) Filed: Aug. 20, 2002

(65) Prior Publication Data

US 2003/0113554 A1 Jun. 19, 2003

(30) Foreign Application Priority Data

Aug. 21, 2001 (JP) ........................................ 2001-249988

(51) Int. Cl.[7] .............................................. B32B 19/00
(52) U.S. Cl. ........................ 428/701; 428/702; 428/212; 501/5; 501/8; 501/61; 501/70
(58) Field of Search .................. 428/701, 702, 428/212; 501/5, 8, 61, 70

(56) References Cited

U.S. PATENT DOCUMENTS

| | | | |
|---|---|---|---|
| 4,162,826 A | * | 7/1979 | Van der Beck et al. .... 359/894 |
| 4,620,264 A | * | 10/1986 | Ushifusa et al. ............ 361/792 |
| 5,065,275 A | * | 11/1991 | Fujisaki et al. .......... 361/321.4 |
| 5,304,517 A | | 4/1994 | Casey et al. |
| 5,635,301 A | * | 6/1997 | Kondo et al. ................ 428/426 |
| 6,447,888 B2 | * | 9/2002 | Suzuki et al. ............... 428/210 |
| 2002/0048666 A1 | * | 4/2002 | Sakamoto .................... 428/209 |
| 2002/0098368 A1 | * | 7/2002 | Takeishi et al. ............ 428/470 |

FOREIGN PATENT DOCUMENTS

| | | | | |
|---|---|---|---|---|
| JP | 62-239443 | * | 10/1987 | ............ G11B/7/24 |
| JP | 5-235550 | | 9/1993 | |
| JP | 6-239648 | | 8/1994 | |
| JP | 10-194828 | | 7/1998 | |
| JP | 11-209178 | | 8/1999 | |
| JP | 2000-226255 | | 8/2000 | |
| JP | 2000-260018 | * | 9/2000 | ............ G11B/5/73 |

* cited by examiner

Primary Examiner—Deborah Jones
Assistant Examiner—Vivek Koppikar
(74) Attorney, Agent, or Firm—Collard & Roe, P.C.

(57) ABSTRACT

In a sintered glass ceramic product including at least three layers each of which is formed by a glass ceramic material, the layers are stacked to be substantially symmetrical in a stacking direction and integrally sintered. Among the sintered layers, each of outermost layers and an inner layer adjacent thereto have crystal phases different from each other. Each of the outermost layers and the inner layer have thermal expansion coefficients $\alpha 1$ and $\alpha 2$ selected so that the relationship given by $0 < \alpha 2 - \alpha 1 < 5$ ppm is satisfied.

3 Claims, 1 Drawing Sheet

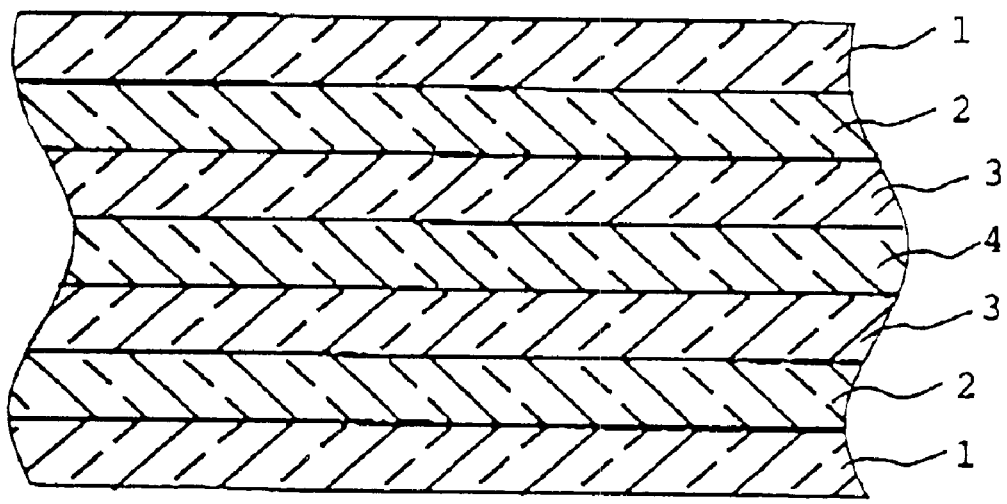

GLASS CERAMIC LAMINATE BECOMING RELATIVELY HIGH IN BENDING STRENGTH AFTER FIRED

BACKGROUND OF THE INVENTION

This invention relates to a glass ceramic laminate which is for use in producing a substrate, such as a wiring board or a circuit board, of a laminate device and which can be fired at a low temperature not higher than 1000° C. and to a sintered glass ceramic product using the glass ceramic laminate.

A substrate, such as a wiring board or a circuit board, of the type has a structure in which an internal conductor is held by a dielectric material. As the internal conductor, use is preferably made of silver or copper low in conductor loss. As the dielectric material, use has widely been made of alumina ceramic. However, alumina ceramic has a firing temperature as high as 1600° C. Therefore, the internal conductor which can be co-fired is restricted to a high-melting-point metal such as molybdenum and tungsten. Such high-melting-point metal has a high conductor resistance, which results in an increase in transmission loss.

Under the circumstances, a glass ceramic material which can be fired at a lower temperature is developed as the dielectric material and put into practical use. The glass ceramic material of the type includes glass powder and ceramic powder and can be fired at a temperature not higher than 1000° C. Therefore, the glass ceramic material is advantageous in that silver or copper low in conductor loss can be used as the internal conductor.

However, the glass ceramic material is generally low in bending strength as compared with alumina ceramic. Therefore, if the glass ceramic material is used in a personal digital assistant (PDA) or the like which is often subjected to mechanical shock, the substrate is easily broken and the reliability is low in a fall test.

SUMMARY OF THE INVENTION

It is therefore an object of the present invention to provide a glass ceramic laminate which can be fired at a temperature not higher than 1000° C. and which becomes relatively high in bending strength after fired.

It is another object of the present invention to provide a sintered glass ceramic product which is made from the glass ceramic laminate of the type described.

Other object of the present invention will become clear as the description proceeds.

According to one aspect of this invention, there is provided a glass ceramic laminate comprising at least three glass ceramic layers stacked and press-bonded to be substantially symmetrical in a stacking direction, each of outermost ones of the glass ceramic layers and an inner layer adjacent thereto being formed by glass ceramic materials which, when fired, have crystal phases different from each other, each of the outermost layers having a first thermal expansion coefficient $\alpha 1$, the inner layer having a second thermal expansion coefficient $\alpha 2$, the relationship between the first and the second thermal expansion coefficients $\alpha 1$ and $\alpha 2$ being given by $0<\alpha 2-\alpha 1<5$ ppm.

According to another aspect of this invention, there is provided a sintered glass ceramic product comprising at least three layers formed by glass ceramic materials which are stacked to be substantially symmetrical in a stacking direction and integrally sintered, each of outermost ones of the layers and an inner layer adjacent thereto having crystal phases different from each other, each of the outermost layers having a first thermal expansion coefficient $\alpha 1$, the inner layer having a second thermal expansion coefficient $\alpha 2$, the relationship between the first and the second thermal expansion coefficients $\alpha 1$ and $\alpha 2$ being given by $0<\alpha 2-\alpha 1<5$ ppm.

BRIEF DESCRIPTION OF THE DRAWING

A sole FIGURE is a sectional view of a part of a glass ceramic laminate according to an embodiment of this invention.

DESCRIPTION OF THE PREFERRED EMBODIMENTS

At first, description will be made of a glass ceramic laminate according to an embodiment of this invention.

A plurality of kinds of glass ceramic materials are stacked to have at least three glass ceramic layers substantially symmetrical in a stacking direction or a vertical direction. After that, the glass ceramic layers are press-bonded. More particularly, the glass ceramic layers are pressed in the vertical direction to be bonded or connected integral with one another. Thus, the glass ceramic laminate is formed. As will later be described in detail, the glass ceramic laminate will be sintered in a later process.

Referring to the figure, the glass ceramic laminate comprises two outermost layers 1, two inner layers 2 adjacent to the outermost layers 1, respectively, two more inner layers 3 adjacent to the inner layers 2, respectively, and an innermost layer 4 adjacent to each of the more inner layers 3. Each outermost layer 1 and each inner layer 2 have crystal phases different from each other as a result of firing. Furthermore, the glass ceramic material of each outermost layer 1 after fired and the glass ceramic material of the inner layer 2 after fired have thermal expansion coefficients $\alpha 1$ and $\alpha 2$ selected so that the relationship $0<\alpha 2-\alpha 1<5$ ppm is satisfied. In other words, the glass ceramic materials are selected so that the relationship given by $0<\alpha 2-\alpha 1<5$ ppm is satisfied where $\alpha 1$ and $\alpha 2$ represent thermal expansion coefficients of each outermost layer 1 and the inner layer 2, respectively.

As a result of firing, each inner layer 2 and each more inner layer 3 are different from each other in at least one of a crystal phase, a crystal type, and a crystal quantity. It is preferable that, after fired, the difference between the thermal expansion coefficient of each inner layer 2 and the thermal expansion coefficient of each more inner layer 3 is smaller than 5 ppm.

As a result of firing, each more inner layer 3 and the innermost layer 4 are different from each other in the crystal phase, the crystal type, and the crystal quantity. It is preferable that, after fired, the difference between the thermal expansion coefficient of each more inner layer 3 and the thermal expansion coefficient of the innermost layer 4 is smaller than 5 ppm.

The glass ceramic laminate mentioned above is sintered to produce a sintered glass ceramic product which may called a sintered laminate. The sintered glass ceramic product thus obtained includes at least three layers formed by the glass ceramic materials stacked to be substantially symmetrical in the stacking direction (i.e., the vertical direction) and integrally sintered. Among these layers, each of outermost layers and an inner layer adjacent thereto have crystal phases different from each other. Each outermost layer has a thermal expansion coefficient $\alpha 1$ smaller than a thermal expansion coefficient $\alpha 2$ of the inner layer. Therefore, the outermost layer is applied with a compressive stress due to the difference in expansion so that the sintered glass ceramic product is increased in bending strength.

However, if the difference between the thermal expansion coefficients is not smaller than 5 ppm, the stress at an interface between the outermost layer and the inner layer is excessively large so that these layers are easily detached or delaminated at the interface. If the thermal expansion coefficients of these layers are equal to each other, the outermost layer is not applied with the compressive stress. In this event, the improvement in bending strength is not expected. If the outermost layer has a thermal expansion coefficient greater than that of the inner layer, the outermost layer is applied with a tensile stress. This results in decrease in strength of the laminate and, in some cases, results in breakage at the center. Taking the above into consideration, the thermal expansion coefficients of the outermost layer and the innermost layer are selected. The compressive stress or the tensile stress results from the difference in thermal contraction coefficient following temperature drop. For convenience of description, the difference in thermal contraction coefficient is replaced by the difference in thermal expansion coefficient following temperature elevation.

In the sintered glass ceramic product, the outermost layer and the inner layer integrally stacked have crystal phases different from each other. This arrangement suppresses the variation in strength. Taking this into account, the crystal phases of the glass ceramic materials after fired are appropriately selected.

In the sintered glass ceramic product, the layers are stacked to be substantially symmetrical in the vertical direction and sintered integral with one another. Therefore, the two outermost layers are applied with compressive stresses substantially equal in magnitude to each other. In this case, the sintered glass ceramic product is hardly bent or warped. Herein, "to be substantially symmetrical in the vertical direction" means "to be substantially symmetrical in the stacking direction of the laminate from the center to the outermost layers". If the thickness of a single layer is great (for example, 0.1 to 0.4 mm) and the number of layers is small (for example, three to five layers), the difference in thickness of each layer and the difference in number of layers have great influence upon the entire structure. It is therefore important to be completely symmetrical. On the other hand, if the thickness of a single layer is small (for example, 0.03 to 0.07 mm) and the number of layers is great (for example, 20 to 30 layers), the difference in thickness of each layer and the difference in number of layers have small influence upon the entire structure. In this case, it is unnecessary to be completely symmetrical in the vertical direction as far as no bending or warping is caused. In other words, it is sufficient to be substantially symmetrical in the vertical direction.

As a combination of the materials for the outermost layer and the inner layer adjacent thereto, some specific examples are shown below. In the following, the former and the latter represent the materials of the outermost layer and the inner layer, respectively.

It is noted here that the laminate need not include only two types of glass ceramic materials but may include other glass ceramic material(s). It is a matter of course that the glass ceramic laminate comprises a large number of glass ceramic layers. In any case, it is preferable that the layers are substantially symmetrical in the stacking direction and that the difference between the thermal expansion coefficients of the layers is smaller than 5 ppm.

Next, description will be made of a method of producing the sintered glass ceramic product described above.

At first, a plurality of kinds of glass ceramic materials are stacked and press-bonded to be substantially symmetrical in the vertical direction to form a glass ceramic laminate. The glass ceramic materials of each outermost layer and an inner layer adjacent thereto are selected so that crystal phases appearing after fired are different from each other and that the relationship given by $0<\alpha 2-\alpha 1<5$ ppm is satisfied where $\alpha 1$ and $\alpha 2$ represent the thermal expansion coefficients of the glass ceramic materials of each outermost layer and the inner layer after fired, respectively. Each of the glass ceramic materials is used in the form of a green sheet. For each of the outermost and the inner layers, a plurality of sheets may be stacked.

Thereafter, the glass ceramic laminate is fired at a temperature not higher than 1000° C. to obtain the sintered glass ceramic product.

Hereinafter, description will be made of several specific examples.

Table 1 shows the glass ceramic materials (samples a to f) forming the glass ceramic laminate while Tables 2 and 3 show the sintered glass ceramic products (samples A to F) obtained by firing the glass ceramic laminates shown in Table 1.

TABLE 1

|  | a | b | c | d | e | f |
|---|---|---|---|---|---|---|
| glass composition |  |  |  |  |  |  |
| $SiO_2$ | 47 | 47 | 54 | 50 | 57 | 20 |
| $TiO_2$ | — | — | — | — | — | 24 |
| $Al_2O_3$ | 26 | — | — | 7 | 7 | — |
| MgO | 4 | — | 6 | 14 | 17 | — |
| CaO | — | 13 | 8 | 22 | 19 | 3 |
| SrO | — | 20 | — | — | — | 7 |
| $Nd_2O_3$ | — | — | — | — | — | 26 |
| PbO | — | — | 16 | — | — | — |
| ZnO | — | 7 | 4 | 7 | — | 20 |
| $K_2O$ | 3 | — | 6 | — | — | — |
| $B_2O_3$ | 20 | 13 | 6 | — | — | — |
| filler | alumina | alumina | alumina | alumina | alumina | alumina |
| glass/filler (mass ratio) | 75/25 | 75/25 | 50/50 | 70/30 | 70/30 | 75/25 |

☐$SiO_2$—$Al_2O_3$—$B_2O_3$ glass ceramic and $SiO_2$—CaO—MgO glass ceramic
(crystal phase: mullite) (crystal phase: diopside)
☐$SiO_2$—$Al_2O_3$—CaO glass ceramic and $SiO_2$—CaO—MgO glass ceramic
(crystal phase: anorthite) (crystal phase: diopside)
☐$SiO_2$—$Al_2O_3$—SrO glass ceramic and $SiO_2$—$Al_2O_3$—CaO glass ceramic
(crystal phase: strontium feldspar) (crystal phase: anorthite)
☐$SiO_2$—CaO—MgO glass ceramic and $SiO_2$—$TiO_2$—$Nd_2O_3$ glass ceramic
(crystal phase: diopside) (crystal phase: neodymium titanate)

TABLE 2

| | A | B | C |
|---|---|---|---|
| dielectric composition | | | |
| SiO$_2$ | 35 | 35 | 27 |
| TiO$_2$ | — | — | — |
| Al$_2$O$_3$ | 45 | 25 | 50 |
| MgO | 3 | — | 3 |
| CaO | — | 10 | 4 |
| SrO | — | 15 | — |
| PbO | — | — | 8 |
| ZnO | — | 5 | 2 |
| K$_2$O | 2 | — | 3 |
| B$_2$O$_3$ | 15 | 10 | 3 |
| thermal expansion coefficient (ppm) | 3.5 | 5.5 | 6.0 |
| bending strength (MPa) | 160 | 220 | 220 |
| crystal phase | mullite | Sr feldspar | anorthite |

TABLE 3

| | D | E | F |
|---|---|---|---|
| dielectric composition | | | |
| SiO$_2$ | 35 | 40 | 15 |
| TiO$_2$ | — | — | 18 |
| Al$_2$O$_3$ | 35 | 35 | 25 |
| MgO | 10 | 12 | — |
| CaO | 15 | 13 | 2 |
| SrO | — | — | 5 |
| Nd$_2$O$_3$ | — | — | 20 |
| ZnO | 5 | — | 15 |
| thermal expansion coefficient (ppm) | 7.5 | 7.8 | 10.0 |
| bending strength (MPa) | 230 | 220 | 190 |
| crystal phase | diopside | diopside | neodymium titanate |

The glass ceramic materials in Table 1 were prepared in the following manner.

At first, raw materials were mixed to obtain a mixture having each composition in Table 1. Thereafter, the mixture was put into a platinum crucible, melted at 1400 to 1500° C. for 3 to 5 hours, and formed by a water-cooled roller into a formed product in the shape of a thin plate. Then, the formed product was coarsely pulverized and then subjected to wet grinding with water added thereto. Thus, glass powder having an average particle size of 1.5 to 3.0 μm was obtained. A filler powder shown in Table 1 was added to the glass powder and mixed therewith to obtain each of the glass ceramic materials a to f.

Next, the glass ceramic materials a to f were fired into the sintered glass ceramic products A to F. Each of the sintered glass ceramic products A to F was evaluated for the thermal expansion coefficient, the bending strength, and the precipitated crystal phase. The results are shown in Tables 2 and 3.

As seen from Tables 2 and 3, each of the sintered glass ceramic products A to F had the thermal expansion coefficient between 3.5 and 10.0 ppm and the bending strength between 160 and 230 MPa.

The thermal expansion coefficient was evaluated by measuring elongation of each sample with respect to temperature elevation from 30 to 400° C. by the use of a thermomechanical analyzer (TMA) and calculating an average thermal expansion coefficient.

The bending strength was evaluated in the following manner. At first, a binder (polybutyl methacrylate), a plasticizer (butyl benzyl phthalate), and a solvent (toluene) were added to the glass ceramic material and kneaded together to produce a slurry. The slurry was formed by the doctor blade technique into a green sheet having a thickness of about 0.2 mm. Then, six similar green sheets were stacked and press-bonded, followed by firing at 900° C. for 20 minutes to obtain a sintered glass ceramic product of a simple or monotonous structure composed of the green sheets of the same kind. Subsequently, the sintered glass ceramic product was processed into a size of 40×10×0.7 mm and then evaluated by the three-point bending test (at a span of 30 mm).

The crystal phase was evaluated in the following manner. The sintered glass ceramic product was pulverized in an alumina mortar and observed by an X-ray powder diffractometer to obtain a diffraction pattern. The diffraction pattern was subjected to qualitative analysis.

Table 4 shows various examples (samples Nos. 1 to 5) of this invention while Table 5 shows comparative examples (samples Nos. 6 to 9). In Tables 4 and 5, A to F represents layers having compositions, respectively, which are equal to that of the products A to F in Tables 2 and 3.

TABLE 4

| | 1 | 2 | 3 | 4 | 5 |
|---|---|---|---|---|---|
| Laminate structure (number of sheets) | A(2)<br>\|<br>D(4)<br>\|<br>A(2) | C(2)<br>\|<br>D(3)<br>\|<br>C(2) | B(1)<br>\|<br>C(1)<br>\|<br>B(1) | D(2)<br>\|<br>F(4)<br>\|<br>D(2) | B(1)<br>\|<br>C(1)<br>\|<br>D(1)<br>\|<br>C(1)<br>\|<br>B(1) |
| α2−α1 (ppm) | 4.0 | 1.5 | 0.5 | 2.5 | 0.5 |
| Bending strength (MPa) | 300 | 280 | 270 | 290 | 270 |
| Standard deviation of bending strength | 15 | 13 | 12 | 12 | 12 |
| Deformation | no | no | no | no | no |
| Interfacial delamination | no | no | no | no | no |

TABLE 5

| | 6 | 7 | 8 | 9 |
|---|---|---|---|---|
| laminate structure (number of sheets) | D(2)<br>\|<br>E(2)<br>\|<br>D(2) | A(2)<br>\|<br>F(1)<br>\|<br>A(2) | C(2)<br>\|<br>B(3)<br>\|<br>C(2) | B(3)<br>\|<br>C(2)<br>\|<br>B(1) |
| α1−α2 (ppm) | 0.3 | 6.5 | −0.5 | 0.5 |
| bending strength (MPa) | 270 | not measured | 100 | not measured |
| standard deviation of bending strength | 35 | — | 15 | — |
| deformation | no | no | no | yes |
| interfacial delamination | no | yes | no | no |

Each sample was prepared in the following manner.

At first, a raw material consisting of glass powder and ceramic powder was prepared. A binder (polybutyl methacrylate), a plasticizer (butyl benzyl phthalate), and a solvent (toluene) were added to the raw material and kneaded together to obtain a slurry. The slurry was formed by the doctor blade technique into a green sheet having a thickness of about 0.2 mm. Subsequently, a plurality of green sheets were stacked and press-bonded to have each of laminate structures (the number of the green sheets in each layer being indicated in parentheses) shown in Tables 4 and 5. Thus, a glass ceramic laminate was obtained. The glass ceramic laminate can be fired at a temperature not higher than 1000° C. Therefore, silver or copper can be used as an internal conductor. Furthermore, it is possible to obtain a sintered laminate having a high strength. Thus, the glass ceramic laminate is appropriate as a substrate material of a multilayer device.

Furthermore, the glass ceramic laminate was degreased and then fired at 900° C. for 20 minutes to obtain a sintered glass ceramic product sample. The sintered glass ceramic product sample was evaluated for the bending strength, the standard deviation thereof, the deformation, and the interfacial delamination.

As seen from Tables 4 and 5, each of the samples as the examples of this invention had a bending strength not lower than 270 MPa which is higher than the bending strength of the sintered glass ceramic product of a simple structure shown in Tables 2 and 3. The standard deviation of the bending strength is not greater than 15. Thus, the variation is small.

On the other hand, in the comparative example No. 6, the outermost layer and the inner layer adjacent thereto had the same crystal phase so that the standard deviation of the bending strength was as large as 35. In the comparative example No. 7, the difference in thermal expansion was excessively large so that delamination occurs at an interface between the outermost layer and the inner layer. In the comparative example No. 8, the outermost layer had a high thermal expansion coefficient so that the bending strength was considerably decreased. In the comparative example No. 9, the laminate structure is not substantially symmetrical in the vertical direction so that deformation occurred.

The bending strength was measured by the three-point bending test in the manner similar to that mentioned above. The standard deviation of the bending strength was obtained by the n–1 method. The deformation was evaluated by visually observing the external appearance of the sintered laminate. The interfacial delamination was evaluated by visually observing the interface between two different materials of the sintered laminate.

The sintered glass ceramic product mentioned above is higher in bending strength than the sintered glass ceramic product including a single kind of material. Therefore, the sintered glass ceramic product mentioned above is appropriate as a substrate of a multilayer device, such as a personal digital assistant, required to have shock resistance.

What is claimed is:

1. A sintered glass ceramic product comprising at least three layers formed by glass ceramic materials which are stacked to be substantially symmetrical in a stacking direction and integrally sintered, each of outermost ones of the layers and an inner layer adjacent thereto having crystal phases different from each other, each of the outermost layers having a first thermal expansion coefficient $\alpha 1$, the inner layer having a second thermal expansion coefficient $\alpha 2$, the relationship between the first and the second thermal expansion coefficients $\alpha 1$ and $\alpha 2$ being given by $0 < \alpha 2 - \alpha 1 < 5$ ppm, wherein each of the outermost layers is formed by a $SiO_2$—$Al_2O_3$—$CaO$ glass ceramic material having a crystal phase of anorthite, while the inner layer is formed by a $SiO_2$—$CaO$—$MgO$ glass ceramic material having a crystal phase of diopside.

2. A sintered glass ceramic product comprising at least three layers formed by glass ceramic materials which are stacked to be substantially symmetrical in a stacking direction and integrally sintered, each of outermost ones of the layers and an inner layer adjacent thereto having crystal phases different from each other, each of the outermost layers having a first thermal expansion coefficient $\alpha 1$, the inner layer having a second thermal expansion coefficient $\alpha 2$, the relationship between the first and the second thermal expansion coefficients $\alpha 1$ and $\alpha 2$ being given by $0 < \alpha 2\ \alpha 1 < 5$ ppm, wherein each of the outermost layers is formed by a $SiO_2$—$Al_2O_3$—$SrO$ glass ceramic material having a crystal phase of strontium feldspar, while the inner layer is formed by a $SiO_2$—$Al_2O_3$—$CaO$ glass ceramic material having a crystal phase of anorthite.

3. A sintered glass ceramic product comprising at least three layers formed by glass ceramic materials which are stacked to be substantially symmetrical in a stacking direction and integrally sintered, each of outermost ones of the layers and an inner layer adjacent thereto having crystal phases different from each other, each of the outermost layers having a first thermal expansion coefficient $\alpha 1$, the inner layer having a second thermal expansion coefficient $\alpha 2$, the relationship between the first and the second thermal expansion coefficients $\alpha 1$ and $\alpha 2$ being given by $0 < \alpha 2 - \alpha 1 < 5$ ppm, wherein each of the outermost layers is formed by a $SiO_2$—$CaO$—$MgO$ glass ceramic material having a crystal phase of diopside, while the inner layer is formed by a $SiO_2$—$TiO_2$—$Nd_2O_3$ glass ceramic material having a crystal phase of neodymium titanate.

* * * * *

UNITED STATES PATENT AND TRADEMARK OFFICE
CERTIFICATE OF CORRECTION

PATENT NO. : 6,699,605 B2  Page 1 of 1
APPLICATION NO. : 10/223796
DATED : March 2, 2004
INVENTOR(S) : Umayahara et al.

It is certified that error appears in the above-identified patent and that said Letters Patent is hereby corrected as shown below:

Column 8, lines 32-33, please change "$0<\alpha 2\ \alpha 1<5$ ppm" to correctly read:

--$0<\alpha 2 - \alpha 1<5$ ppm--.

Signed and Sealed this

Fifteenth Day of August, 2006

JON W. DUDAS
*Director of the United States Patent and Trademark Office*